(12) United States Patent
Servant et al.

(10) Patent No.: US 7,799,306 B2
(45) Date of Patent: Sep. 21, 2010

(54) METHOD OF PURIFYING METALLURGICAL SILICON BY DIRECTIONAL SOLIDIFICATION

(75) Inventors: Florence Servant, Grenoble (FR); Denis Camel, Chambery (FR); Beatrice Drevet, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/311,777

(22) PCT Filed: Nov. 2, 2007

(86) PCT No.: PCT/FR2007/001818

§ 371 (c)(1),
(2), (4) Date: Apr. 13, 2009

(87) PCT Pub. No.: WO2008/065270

PCT Pub. Date: Jun. 5, 2008

(65) Prior Publication Data

US 2010/0003183 A1    Jan. 7, 2010

(30) Foreign Application Priority Data

Nov. 2, 2006   (FR) .................................. 06 09584

(51) Int. Cl.
*C01B 33/02*   (2006.01)
(52) U.S. Cl. ........................ 423/350; 423/349
(58) Field of Classification Search ................ 423/349, 423/350, 373
See application file for complete search history.

(56) References Cited

U.S. PATENT DOCUMENTS

| | | | | |
|---|---|---|---|---|
| 2,947,923 | A * | 8/1960 | Pardue | 257/565 |
| 4,304,763 | A * | 12/1981 | Dietl et al. | 423/348 |
| 5,714,004 | A * | 2/1998 | Okuno | 117/3 |
| 6,136,091 | A * | 10/2000 | Yamazaki et al. | 117/81 |
| 2006/0144326 | A1 | 7/2006 | Einhaus et al. | |
| 2007/0202029 | A1* | 8/2007 | Burns et al. | 423/324 |
| 2008/0292525 | A1* | 11/2008 | Eriksen et al. | 423/350 |

FOREIGN PATENT DOCUMENTS

| | | |
|---|---|---|
| EP | 0 748 884 A1 | 12/1996 |
| EP | 0 887 442 A1 | 12/1998 |
| FR | 2 831 881 A1 | 5/2003 |
| FR | 2 853 913 A1 | 10/2004 |
| GB | 2 084 978 A | 4/1982 |
| WO | WO 03/014019 A1 | 2/2003 |

* cited by examiner

*Primary Examiner*—Timothy C Vanoy
*Assistant Examiner*—Michelle Hou
(74) *Attorney, Agent, or Firm*—Oliff & Berridge, PLC

(57) ABSTRACT

The method enables metallurgical silicon to be purified by directional solidification to obtain solar or photovoltaic grade silicon. A crystallization step uses at least one silicon seed, preference of solar grade or even microelectronic grade, having for example a purity substantially equal to or greater than a predetermined purity of the solar-grade silicon. The silicon seed which covers the bottom of the crucible can come from a previous crystallization or be formed by a silicon wafer. The use of a single-crystal or textured multi-crystal seed enables crystallographic orientation of the solar-grade silicon. An intermediate layer of solid metallurgical silicon can be arranged on the silicon seed and a metallurgical silicon feedstock is arranged on the intermediate layer.

15 Claims, 1 Drawing Sheet

METHOD OF PURIFYING METALLURGICAL SILICON BY DIRECTIONAL SOLIDIFICATION

BACKGROUND OF THE INVENTION

The invention relates to a method for purifying metallurgical silicon by directional solidification to obtain solar- or photovoltaic-grade silicon.

STATE OF THE ART

Photovoltaic cells are generally made from crystallized silicon. The silicon ingots used mainly have a multi-crystal structure: they are formed by non-oriented single-crystal grains, with a typical size of around one centimeter, joined to one another by grain boundaries and resulting from columnar growth. Their growth takes place in a crystallization furnace, for example of the Heat Exchange Method (HEM) or Bridgman type enabling a silicon load to be crystallized in a crucible having a controlled axial temperature gradient thereby ensuring columnar growth.

Crystallization generally begins by germination of small crystals that germinate from the bottom of the crucible and, when a stationary flat front regime has been established, is continued by growth of larger columnar grains.

Three sorts of elementary silicon are usually distinguished according to their metallic impurity content:
  metallurgical silicon, having a metallic impurity content of more than 0.01%,
  solar-grade silicon, having a metallic impurity content comprised between 0.01% and 0.000001%,
  and microelectronic silicon, having a metallic impurity content of less than 0.000001%.

Furthermore what is often meant by solar grade silicon (SoG-Si) is the material before final crystallization, photovoltaic silicon (PV) meaning the material after final crystallization of the solid designed to form the photovoltaic cells.

The raw material used for crystallization of solar-grade silicon often comes from microelectronic waste which then has a much greater purity than the purity required for photovoltaic applications. Confronted with the current shortage of microelectronic silicon waste, less costly and simpler metallurgical silicon purification solutions than the gas-based methods currently used are being sought for to cope with the increasing demand for solar- or photovoltaic-grade silicon.

The document WO03/014019 proposes a purification method by plasma treatment followed by segregation in an ingot mould. However, even if the purification method by segregation is pushed to the limit, this method only enables the metallic impurity content to be reduced by a factor 25 whereas a much larger reduction can be envisaged on account of the partition coefficients in silicon, about $10^{-5}$ for Iron and $10^{-4}$ for most other metallic impurities.

One solution adopted in the PHOTOSIL® method described in the document FR2831881 is to purify metallurgical silicon by a liquid process involving three successive steps. The first consists in melting the silicon and in then casting it in an ingot mould to segregate the impurities (in particular the metallic impurities) rapidly. The second purification step is performed by plasma treatment in a liquid bath to obtain a solar-grade silicon (SoG-Si). Finally, the last step is crystallization-segregation of the silicon into a multi-crystal ingot of photovoltaic grade (PV). However, the crystallization step also meets with purification limits (factor 100 approximately) despite good control of the thermal conditions in a crystallization furnace.

The document GB 2084978 describes a method for purifying metallurgical silicon that uses a seed and a hemispherical solid/liquid interface.

The document EP 0748884 further describes a temperature control system suitable for crystallization from a single-crystal seed in order to increase the repeatability of growth of silicon with excellent crystallographic properties.

OBJECT OF THE INVENTION

The object of the invention consists in proposing a simple method enabling silicon metallurgical to be purified to obtain solar- or photovoltaic-grade silicon having a good purity.

According to the invention, this object is achieved by the appended claims, and more particularly by the fact that the method comprises a crystallization step using at least one silicon seed preferably having a purity of at least solar-grade silicon covering the bottom of the crucible.

BRIEF DESCRIPTION OF THE DRAWINGS

Other advantages and features will become more clearly apparent from the following description of particular embodiments of the invention given for non-restrictive example purposes only and represented in the appended drawings in which.

DESCRIPTION OF A PREFERRED EMBODIMENT OF THE INVENTION

Figure 1:
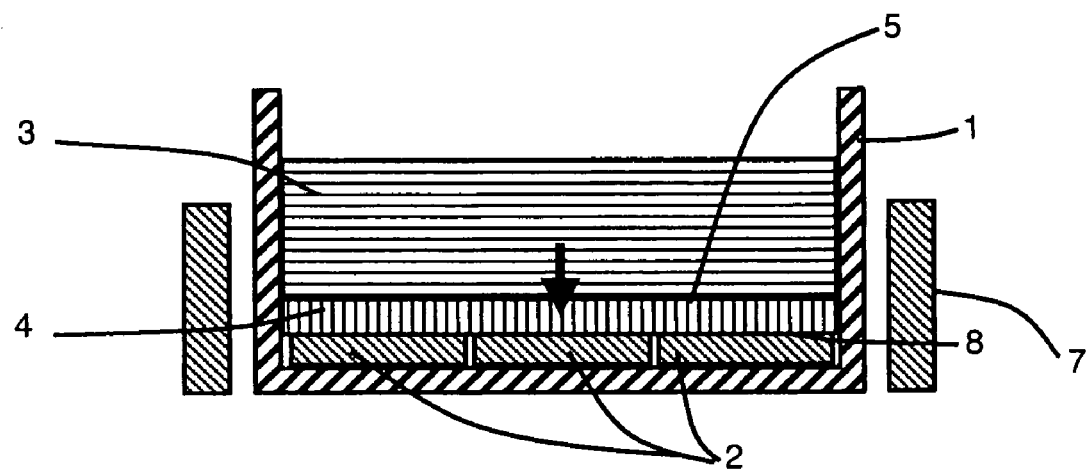
FIGS. 1 and 2 respectively represent two steps of a particular embodiment of the method according to the invention.

FIG. 1 represents a crucible 1 for purifying metallurgical silicon by directional solidification to obtain solar- or photovoltaic-grade silicon having a predetermined purity. In a crystallization step, at least one silicon seed 2 preferably having a purity of at least solar grade is used.

The silicon seed has for example a purity of solar or photovoltaic grade (having a metallic impurity content comprised between 0.01% and 0.000001%), or even a microelectronic-grade purity (having a metallic impurity content of less than 0.000001%). A solar- or photovoltaic-grade seed 2 having a metallic impurity content of less than 0.01%, for example 0.0001%, can in particular be used.

Silicon seed 2 ideally has a purity that is greater or substantially equal to the predetermined purity of the solar-grade silicon it is desired to obtain.

Figure 2:
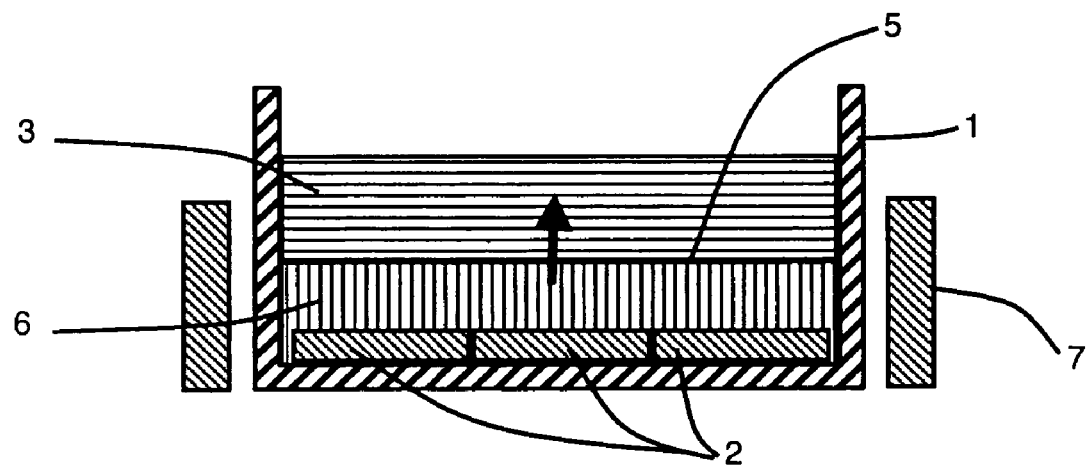

In FIGS. 1 and 2 for example, three seeds 2 are used. Seeds 2 in FIGS. 1 and 2 are formed by silicon wafers and are arranged on the bottom of crucible 1.

In FIG. 1, the crucible is loaded with metallurgical silicon 3 which is preferably arranged on an intermediate layer 4 of solid silicon of at least metallurgical grade. Intermediate layer 4 is arranged on silicon seeds 2. Metallurgical silicon feedstock 3 can be arranged in liquid or solid form in crucible 1.

When crucible 1 is heated strongly via the top, a separation front 5 between a top liquid phase and a bottom solid phase descends in the direction of the bottom of crucible 1 so that intermediate layer 4 melts progressively, as illustrated in FIG. 1.

When metallurgical silicon feedstock 3 (and intermediate layer 4 when present) has completely melted, seed 2 starts to melt. The cooling power via the bottom of the crucible is then increased so that separation front 5 between the liquid and solid phases stops in the top part of seed 2 and moves progressively towards the top of crucible 1, as illustrated in FIG.

2. The solid phase crystallizing in the bottom part of crucible 1 is thus solar-grade or photovoltaic-grade silicon 6.

Purification is performed during crystallization by using solar- or photovoltaic- or microelectronic-grade silicon seed 2 which covers the bottom of crucible 1. The advantage of using silicon seed 2, and in particular at least solar-grade silicon seed, is to enable a good segregation of metallurgical silicon 3. In the absence of seed on the whole of the bottom of the crucible, a transient heterogeneous germination phase initiated from the bottom of crucible 1 or from the bottom of an ingot mould will in fact give rise to formation of a destabilized solidification front, which is detrimental to the purity of the ingot obtained, even if subsequent stationary solidification is performed under ideal conditions, i.e. for example with a flat front, a slow growth rate and efficient stirring of the bath. This limiting has a twofold cause: dendritic solidification of the overmelted liquid results in incorporation of a liquid rich in impurities in the solid silicon matrix formed. Migration of this liquid in the gradient temperature then makes the impurities rise in the subsequently formed solid.

By means of silicon seed 2 of at least solar grade, much better purification rates are obtained (close to the theoretically expected values) than those currently obtained when segregation is performed in an ingot mould or when crystallization is performed without a seed. Another advantage is to be able to perform the segregation and crystallization operations in a single step, or even to be able to eliminate the preliminary segregation steps. Finally, the use of silicon seed 2 of at least solar grade increases the crystalline state of the ingot obtained, while at the same time providing greater flexibility in the choice of the thermal conditions for growth.

Seed 2 used may be multi-crystal or single-crystal and have a purity that is greater than or substantially equal to the purity required in the ingot. It can originate from a previous crystallization, or, for the first melt, be formed by multi-crystal or single-crystal silicon wafers depending on whether it is desired to orient the grains of the formed ingot or not. Crystallographic orientation of the solar- or photovoltaic-grade silicon designed to be formed by use of a single-crystal or textured multi-crystal seed 2, i.e. with grains presenting a preferential crystallographic orientation in the solidification direction, can in fact be performed.

Due to the large size of crystallization crucibles 1, several rectangular or square seeds 2 are arranged side by side to cover the bottom of crucible 1 limiting the spaces between two seeds 2. However, a single bulk seed can also be used to cover the bottom of crucible 1. Moreover, it is not strictly necessary for the seed or seeds to reach the vertical walls, as this area will subsequently be descaled. The crystalline state of seed 2 is only of importance for the crystalline quality. Advantageously, if a paving is used, it merely has to be sufficiently joined for the molten liquid not to run between the seeds and reach the bottom of the crucible. A paving obtained with seeds having a thickness of 1 cm spaced 1 mm apart can be used, as solidification takes place before the liquid reaches the bottom of the crucible. Advantageously, the seed spacings can be provided at the level of the future ingot cutting areas to avoid polluting the useful areas of the ingot. Moreover, association with uni-directional solidification enables vertical rising of the impurities which limits pollution of the useful central area of the ingot.

Metallurgical silicon feedstock 3 has a purity of metallurgical type either extracted directly from the silica reduction furnaces or already purified by plasma treatment or refining for example. The feedstock can be arranged directly on seed 2 if the height of seed 2 and control of the thermal conditions allow. The feedstock can also, as described above, be superposed on intermediate silicon layer 4 of metallurgical grade equivalent to that of the feedstock. Intermediate layer 4, designed to be melted, can come from a rapid solidification performed in an ingot mould. The advantage of intermediate layer 4 is to prevent melting of seed 2 and thus to act as thermal buffer. The contact between seed 2 and the liquid silicon is then less brutal than without intermediate layer 4 and takes place homogeneously over the whole surface of seed 2. Intermediate layer 4 further facilitates placing of several seeds 2 side by side securing the latter mechanically. This enables growth to be performed on seed with a flat rising front 5 (FIG. 2) right from the beginning of solidification, which is indispensable for segregation and crystallization. Intermediate layer 4 becomes particularly advantageous in a method using a casting of molten silicon on seed 2 to prevent deterioration of the seed due to the effect of the thermal shock.

It is possible to insert an additional space between seed 2 and intermediate layer 4 and to separate intermediate layer 4 and seed 2 by a predetermined gap, which enables better control of bringing seed 2 into contact with liquid silicon. The predetermined gap can for example be obtained by means of a large roughness of a rear surface 8 of intermediate layer 4 arranged facing seed 2.

Simple temperature measurement made at the bottom of crucible 1, i.e. at the level of seed 2, enables a temperature jump to be detected when the liquid silicon comes into contact with seed 2. When such a temperature increase is detected at the level of seed 2, increasing a cooling power at the bottom of crucible 1 enables the direction of the phase separation front 5 to be reversed and crystallization to be initiated. The use of an intermediate layer 4 associated with the above procedure therefore enables the necessary thickness of seed 2 to be minimized while keeping its crystalline quality.

In the flat solidification front configuration, a good segregation is also enhanced by efficient convection of the silicon bath. Convection can be amplified either by completing the heat input of the top surface by lateral inputs or by adding a forced convection, for example by means of an alternating, rotating or sliding magnetic field.

Heat extraction is preferably performed by placing the bottom surface of the seed in direct contact with a heat-conducting sole, unlike conventional methods where the silicon is separated from the cooling sole by an insulating silica crucible bottom. The sole is placed in contact with a cooling circuit via an interface having a heat exchange of predetermined value. This configuration provides the possibility of achieving greater heat extraction fluxes than conventional methods, using a silica crucible. A larger temperature gradient in the liquid and/or a solidification rate and/or a larger crystallized ingot height are thereby obtained, which enables productivity to be increased while ensuring morphological stability of the solidification front. The heat flux is rendered almost unidirectional and the isotherms in the solid silicon 6 are almost flat due to a uniform temperature of the cooling circuit, a uniform heat exchange coefficient and by means of lateral heat shields 7 represented in FIGS. 1 and 2. Columnar growth is thus ensured and the thermal-mechanical stresses in the cooled solid 6 are minimized.

The ideal solution is to work in a Bridgman-type furnace with fixed heating via the top and sides and downwards movement of the ingot at the same rate as the solidification front. Such a configuration both enables a good convection to be obtained in the liquid part (which enables front 5 to be segregated and not destabilized at microscopic level) and ensures flat isotherms in solid silicon 6.

The speed of front 5 when solidification takes place and the temperature gradient determined by the extracted heat are optimized in the following manner: for the convection conditions actually prevailing in crucible 1, the maximum solidification rate compatible with the required segregation is determined by trial and error. The temperature gradient is then chosen sufficiently high to ensure morphological stability of front 5 at the chosen solidification rate and for the given composition of the metallurgical silicon load.

For example, heating of the bath in a Bridgman furnace is performed by heating elements placed above and on the sides of the molten silicon. The lateral heat flux induces a natural convection movement in the bath, descending on the axis and rising at the periphery. Heat extraction is performed by placing the seed in direct contact with a graphite conducting sole. Extraction is determined at the beginning by radiation of the graphite in the cooled chamber, and then by convective heat exchange with the atmosphere at lower temperature. Seed 2 used is preferably a multi-crystal silicon wafer with a typical thickness of 1 cm extracted for example from an ingot used for fabricating photovoltaic cells. An intermediate layer 4 with a typical thickness of 1 cm originates from prior segregation by casting in an ingot mould.

In a second example, heating of the bath in a HEM furnace is performed by means of an induction heating system. Initially, the silicon is heated by means of a graphite susceptor located above. As soon as the silicon starts to melt, direct electromagnetic coupling on the silicon completes the heating and causes additional stirring of the liquid. Heat extraction is performed by placing the conducting sole in contact with a cooling system able to evacuate typically 100 kW/m². Seed 2 used is composed of several multi-crystal silicon wafers cut from the ingots produced beforehand by directional crystallization without a seed. An intermediate layer 4 originates from a prior segregation by casting in an ingot mould.

The invention claimed is:

1. A method for purifying silicon comprising:
providing a crucible with a silicon seed covering a bottom of the crucible and a molten raw silicon of metallurgical grade silicon, the molten raw silicon covering the seed, and
performing directional solidification of the molten raw silicon to obtain solar-grade or photovoltaic-grade silicon.

2. The method according to claim 1, wherein the silicon seed has a purity of at least solar grade.

3. The method according to claim 2, wherein the silicon seed has a microelectronic-grade purity.

4. The method according to claim 2, wherein the silicon seed has a solar- or photovoltaic-grade purity.

5. The method according to claim 1, wherein the solar- or photovoltaic-grade silicon having a predetermined purity, the silicon seed has a purity at least equal to the predetermined purity of the solar-grade or photovoltaic-grade silicon.

6. The method according to claim 5, wherein the silicon seed has a purity substantially equal to the predetermined purity of the solar-grade or photovoltaic-grade silicon.

7. The method according to claim 1, wherein the silicon seed comes from a crystallization.

8. The method according to claim 1, wherein the silicon seed is formed by a silicon wafer.

9. The method according to claim 1, wherein the silicon seed is a single-crystal or textured multi-crystal seed.

10. The method according to claim 1, wherein the silicon seed is comprised of several rectangular silicon seeds arranged side by side.

11. The method according to claim 1, wherein an intermediate layer of solid silicon of at least metallurgical grade is arranged on the silicon seed and a metallurgical silicon load is arranged on the intermediate layer.

12. The method according to claim 11, wherein the intermediate layer and the silicon seed are separated by a predetermined gap.

13. The method according to claim 12, wherein the predetermined gap is obtained by means of a large roughness of a surface of the intermediate layer arranged facing the seed.

14. The method according to claim 1, further comprising: a temperature measurement step at a level of the silicon seed and, when a temperature increase is detected at the level of the silicon seed, an increase step of a cooling power so as to initiate crystallization.

15. The method according to claim 1, wherein a bottom surface of the silicon seed is placed in direct contact with a heat-conducting sole.

* * * * *